United States Patent
Murakami

(10) Patent No.: US 6,445,642 B2
(45) Date of Patent: Sep. 3, 2002

(54) SYNCHRONOUS DOUBLE DATA RATE DRAM

(75) Inventor: Naoki Murakami, Kawasaki (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/738,190

(22) Filed: Dec. 15, 2000

(30) Foreign Application Priority Data

Dec. 16, 1999 (JP) .......................................... 11-356797

(51) Int. Cl.$^7$ ................................................. G11C 8/00
(52) U.S. Cl. ................................. 365/233; 365/189.01
(58) Field of Search ............................ 365/233, 189.01

(56) References Cited

U.S. PATENT DOCUMENTS 6,147,926 A * 11/2000 Park ........................... 365/233

* cited by examiner

Primary Examiner—M. Tran
(74) Attorney, Agent, or Firm—Hayes Soloway P.C.

(57) ABSTRACT

A DDR-SDRM includes a data write section including a latch section for latching first write data at a rising edge of a data strobe signal and second write data at a falling edge of the data strobe signal, and a write buffer section for writing the first write data and the second write data at a time based on the signals generated from the data strobe signal. A read operation is conducted based on the system clock signal.

17 Claims, 7 Drawing Sheets

SYNCHRONOUS DOUBLE DATA RATE DRAM

BACKGROUND OF THE INVENTION

1. Field of the Invention

The present invention relates to a synchronous double data rate DRAM (DDR-SDRM) and, more particularly to an improvement of the read/write performance of a DDR-SDRM.

2. Description of the Related Art

In a DDR-SDRM (which may be referred to as simply SDRAM, hereinafter), the read/write operation is controlled by a system clock signal CLK supplied as an external clock signal, whereas read/write data are transferred between the SDRAM and the external circuit in synchrony with a data strobe signal DQS. The data strobe signal DQS occurs with a specified phase delay with respect to the clock pulse in the system clock signal CLK. The pulses in both the system clock signal CLK and the data strobe signal DQS have the same pulse duration.

More specifically, the read/write operation is controlled in synchrony with the system clock signal CLK whereas the latch of the input write data is controlled with the data strobe signal DQS supplied form outside the DRAM. The relationship between the system clock signal CLK and the data strobe signal DQS is specified by the JEDEC standard. For example, it is prescribed that the phase difference between the system clock signal CLK and the data strobe signal DQS reside between 75% and 125% of the clock period Tck of the system clock signal CLK.

FIG. 1 shows signal flows in a conventional DDR-SDRM during a write operation, the DDR-SDRM including a data write section 10, data read section 30 and an address processing section not shown in the figure. The system clock signal CLK is supplied through a clock buffer 11 to a command decoder 12, a write timing generator 13 and a second-stage data latch (latch section) 18, whereas the data strobe signal DQS is supplied to a first-stage data latch (latch section) 17. In the DDR-SDRM, a read/write operation is controlled in synchrony with the system clock signal CLK whereas the latch of the input data DQ at the first-stage latch 17 is controlled by the data strobe signal DQS.

FIG. 2 shows a timing chart of the signals in the DDR-SDRM of FIG. 1. A write cycle is started with a first pulse P1 of the system clock signal CLK. The write data DQ and the data strobe signal DQS are supplied from outside the SDRM. First write data DQ0 is latched at time t0 by responding to the rising edge of the data strobe signal DQS and second write data DQ1 is latched at time t1 by the falling edge of the same data strobe signal DQS in the first-stage latch 17. The second-stage latch 18 latches both the write data DQ0 and DQ1 at time t2 by responding to the rising edge of the system clock signal CLK to deliver both the write data DQ0 and DQ1 to the write buffer (write buffer section) 14. The I/O lines 19 includes a first pair of complementary I/O lines disposed for bit lines having even serial numbers, and a second pair of complementary I/O lines disposed for bit line pairs having odd serial numbers.

The write buffer 14 delivers a differential voltage signal corresponding to the write data latched at the rising edge of the data strobe signal DQS through one of the pairs of complementary I/O lines 19, and delivers at the same time a differential voltage signal corresponding to the write data latched at the falling edge of the data strobe signal DQS through the other of the pairs of the I/O lines 19. The former I/O lines are called herein I/O lines (R) whereas the latter I/O lines are called herein I/O lines (F). The potential difference of the differential voltage signal is 2.2 volts in this example. The write operation ends at time t3b at which the I/O lines 19 are subjected to balancing or equalizing the pair of I/O lines 19.

A read cycle is started at time t4 with a fourth pulse P4 in the system clock signal CLK, and a read amplifier 15 delivers a pair of differential voltage signals through the I/O lines 19, the differential voltage assuming 0.2 volts in the read operation. The read data DQ2 and DQ3 and the data strobe signal DQS are fed to outside from the DDR-SDRM. The data strobe signal DOS is generated in the DDR-SDRM during the read operation in synchrony with the system clock signal CLK. The time interval between t3b at which the write operation is finished and t4 at which the read operation is started is used as a balancing time interval, during which the I/O lines 19 are isolated from the bit lines of the memory cell plate 16.

In the above operation, the DDR-SDRM operates for equalizing the pair of I/O lines 19, which had a potential difference of 2.2 volts in the write operation, during the balancing time interval for preparing the next read operation. However, the time length may be too short for a safe operation, especially if the read data in the succeeding read operation is opposite to the write data supplied in the write operation.

Assuming that the clock period Tck of the system clock signal CLK is 6.5 ns, and coupling operation for coupling the I/O lines and the bit lines together consumes 4 ns, then the available time length for the balancing of the I/O lines is equal to:

$$6.5-4=2.5 \text{ ns.}$$

In this case, the available balancing time interval is too short to assure a safe isolation of the I/O lines from the bit lines.

SUMMARY OF THE INVENTION

In view of the above problem in the conventional technique, it is an object of the present invention to provide a DDR-SDRM, which is capable of solving the above problem and operates at a higher speed and with a higher reliability.

The present invention provides a DDR-SDRM including a memory cell array including a plurality of memory cells, an address signal processing section for receiving and processing an address signal for specifying an address of one of the memory cells, the address signal processing section operating in synchrony with a system clock signal, a data write section for receiving write data and writing the write data into the one of the memory cells in a write cycle, and a data read section for responding to the system clock signal to read data from the one of the memory cells in a read cycle to deliver read data, the data write section operating based on a data strobe signal transferred in synchrony with the write data to receive the write data from outside the DDR-SDRM and deliver the write data through I/O lines to the one of the memory cells.

In accordance with the present invention, the write operation conducted based on the data strobe signal by the data write section assures a sufficient balancing time interval for balancing the I/O lines, whereby a safe read data can be obtained during a succeeding read operation.

The above and other objects, features and advantages of the present invention will be more apparent from the following description, referring to the accompanying drawings.

PREFERRED EMBODIMENTS OF THE INVENTION

Figure 1:
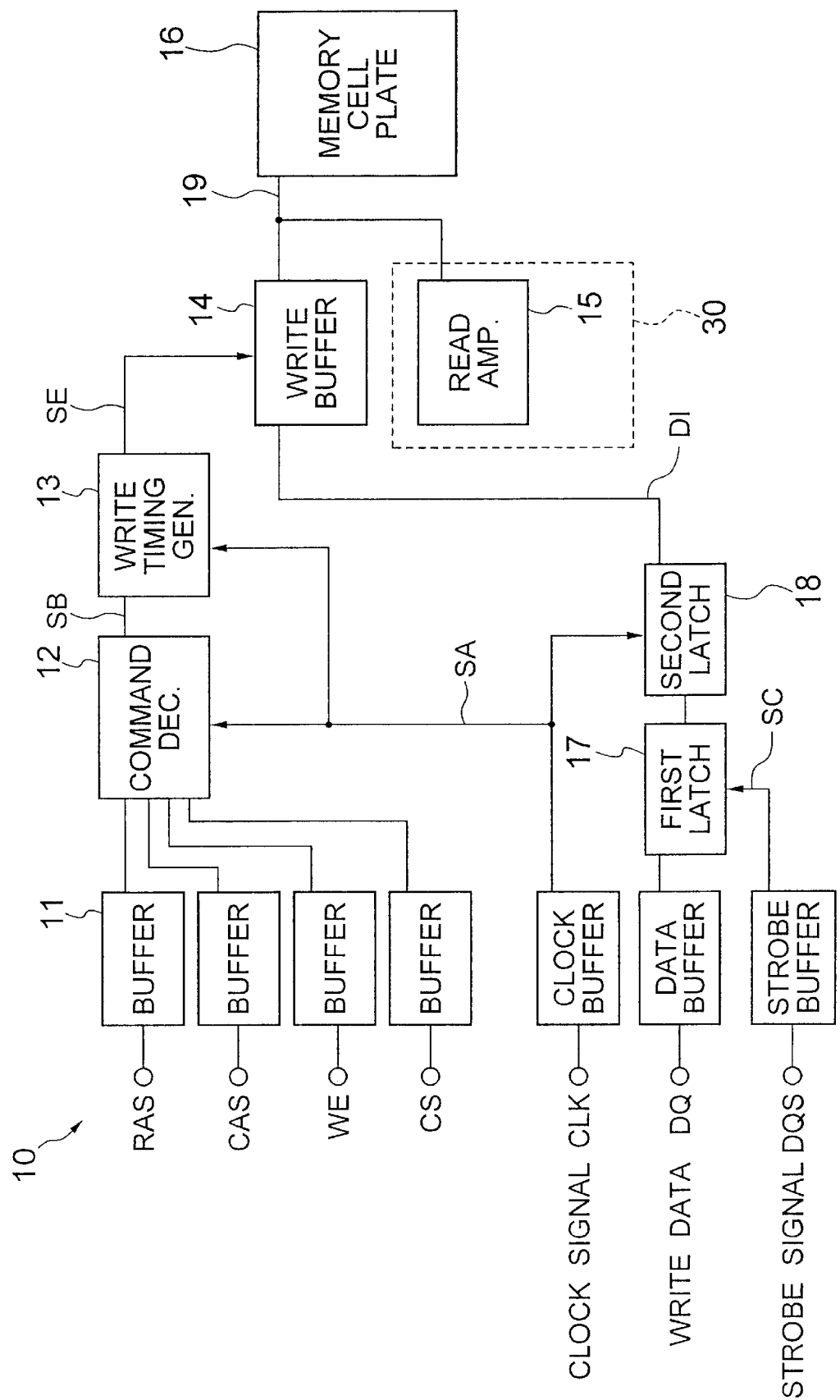
FIG. 1 is a block diagram of a conventional DDR-SDRM, showing signal flows during a write operation thereof.
Figure 2:
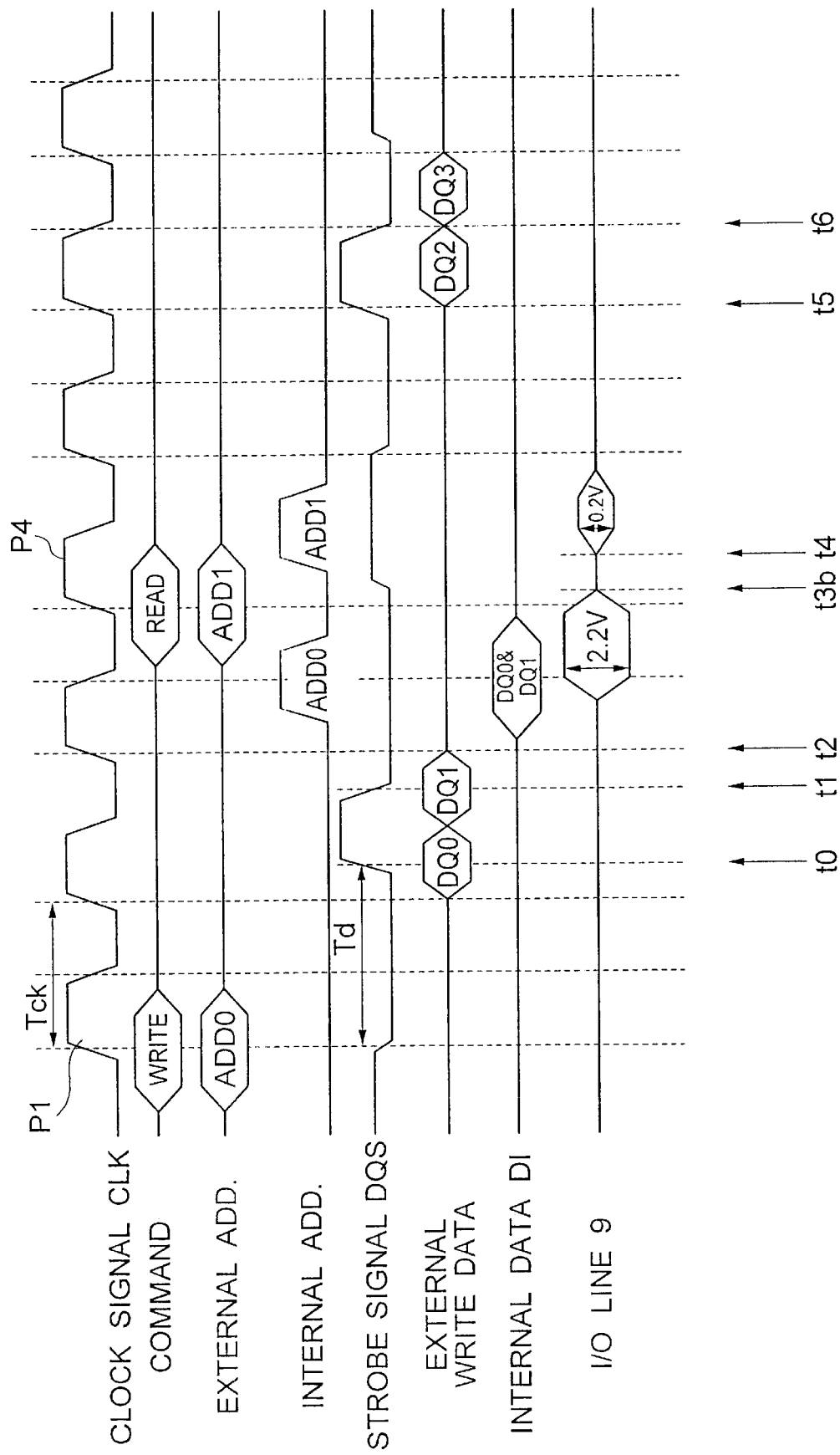
FIG. 2 is a timing chart of signals in the DDR-SDRM of FIG. 1.

Now, the present invention is more specifically described with reference to accompanying drawings, wherein similar constituent elements are designated by similar reference numerals throughout the drawings.

Figure 3:
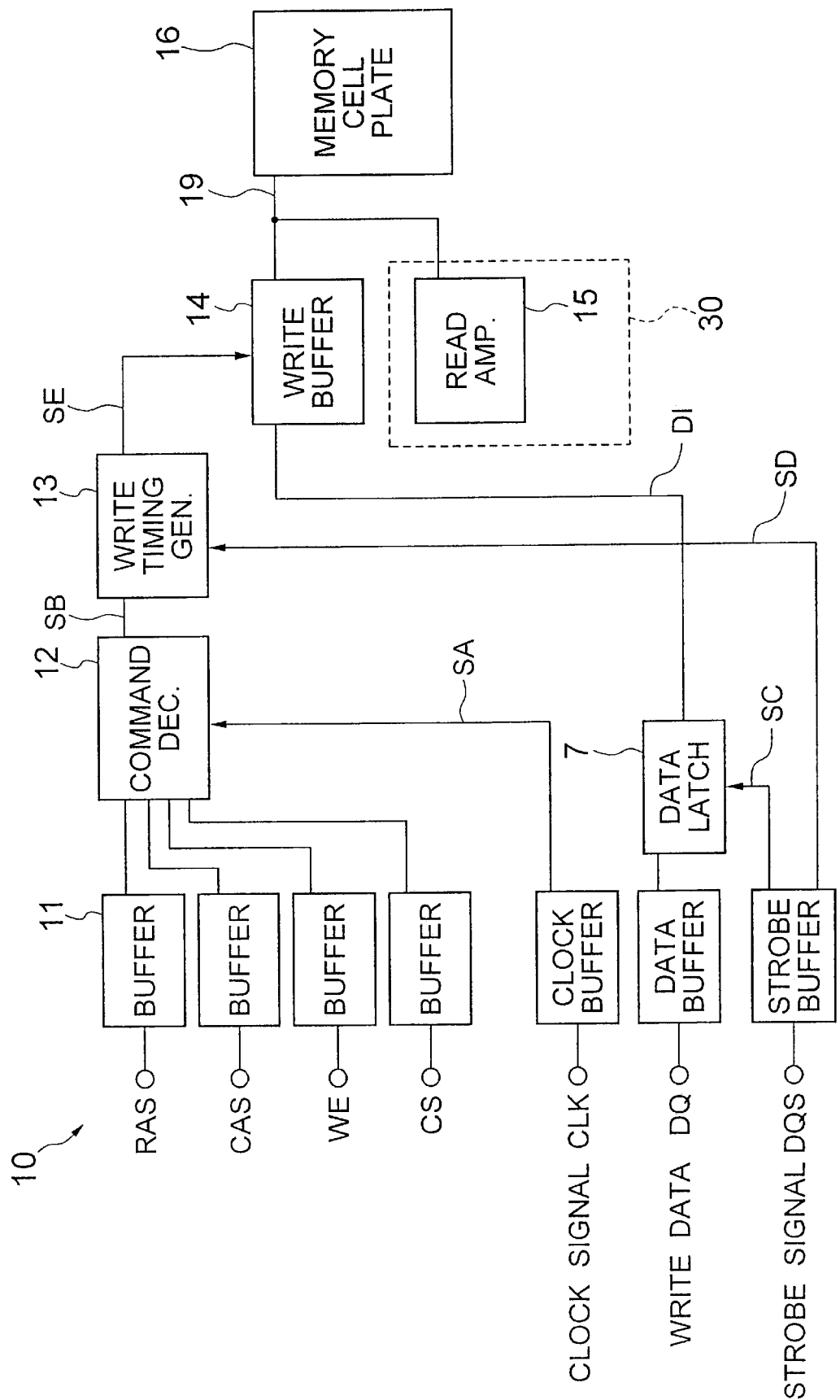
FIG. 3 is a block diagram of a DDR-SDRM according to a first embodiment of the present invention, showing signal flows during a write operation thereof.

Referring to FIG. 3, a DDR-SDRM according to a first embodiment of the present invention includes a memory cell array or memory cell plate 16, a data write section 10, a data read section 30 wherein only a read amplifier 15 is depicted, and an address processing section not shown in the figure.

Figure 7:
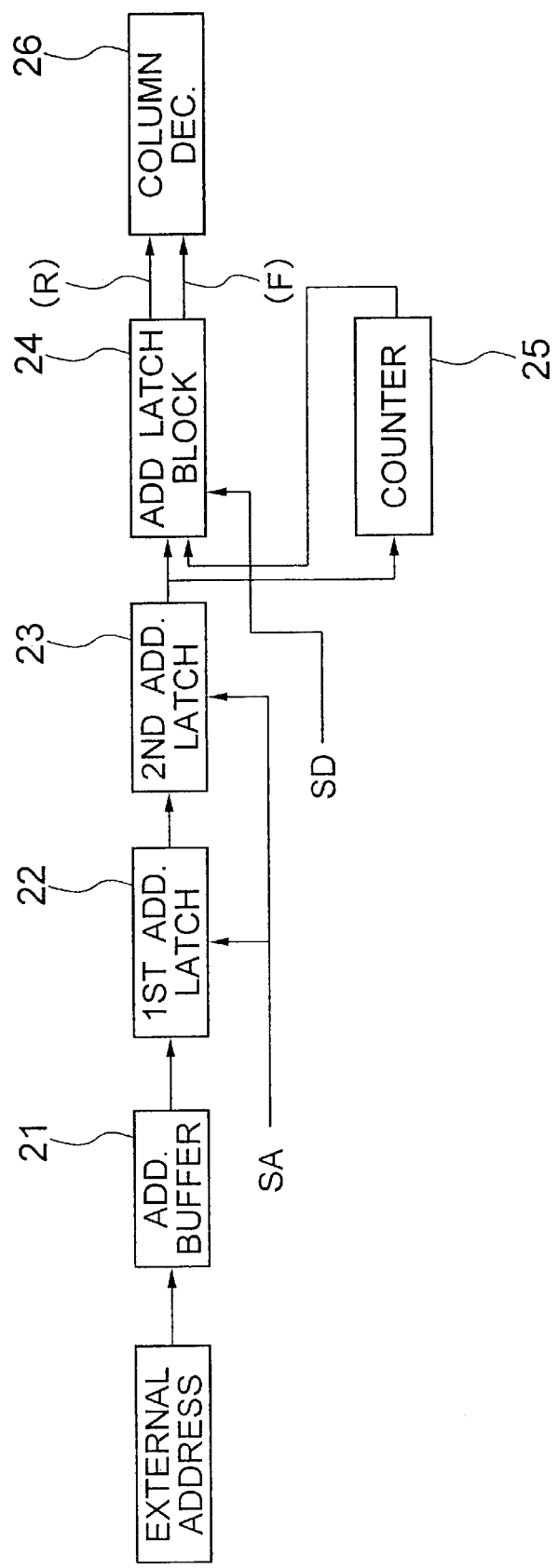
FIG. 7 is a block diagram of the address processing section provided in the DDR-SDRM of FIG. 5.

The data write section 10 includes a plurality of input buffers 11, a command decoder 12, a write timing generator 13, a write buffer (buffer section) 14, and a data latch (latch section) 17. The DDR-SDRM operates for read/write processing with a burst length of two, wherein a read/write operation is conducted for a pair of data at a single read/write cycle to memory cells having successive addresses. The configuration of the address processing section is shown in FIG. 7.

The input buffers 11 in the data write section 10 receive external signals to deliver the same to respective internal sections. The command decoder 12 receives row address strobe (RAS), column address strobe (CAS), write enable signal (WE) and chip select signal (CS) to deliver decoded address signal SB in association with these signals. The write timing generator 13 generates timing control signals for the write operation. The data latch 17 latches a pair of write data DQ at the rising edge and the falling edge, respectively, of the data strobe signal DQS, and supplies the latched data DQ to the write buffer 14. The write buffer 14 delivers, through the complementary I/O lines 19, write data to the memory cells selected based on the address signal. The read amplifier 15 reads data through the I/O lines 19 from the memory cell selected based on the address signal. The I/O lines 19 include two sets of complementary I/O lines including I/O lines (R) and I/O lines (F) for transferring the pair of write data at a time.

The memory cell plate 16 includes a plurality of memory cells arranged in a matrix, and a plurality of word lines each disposed for a corresponding row of the memory cells. If a memory cell is selected, a corresponding bit line pair is connected to the complementary I/O lines 19, and a corresponding word line is activated.

The system clock signal CLK is delivered to the command decoder 12, whereas the data strobe signal DQS is delivered to the write timing generator 13 and the data latch 17. In the present embodiment, a read operation is basically controlled in synchrony with the system clock signal CLK, whereas a write operation and data latch of the write data are controlled in synchrony with signals generated based on the data strobe signal DQS.

Figure 4:
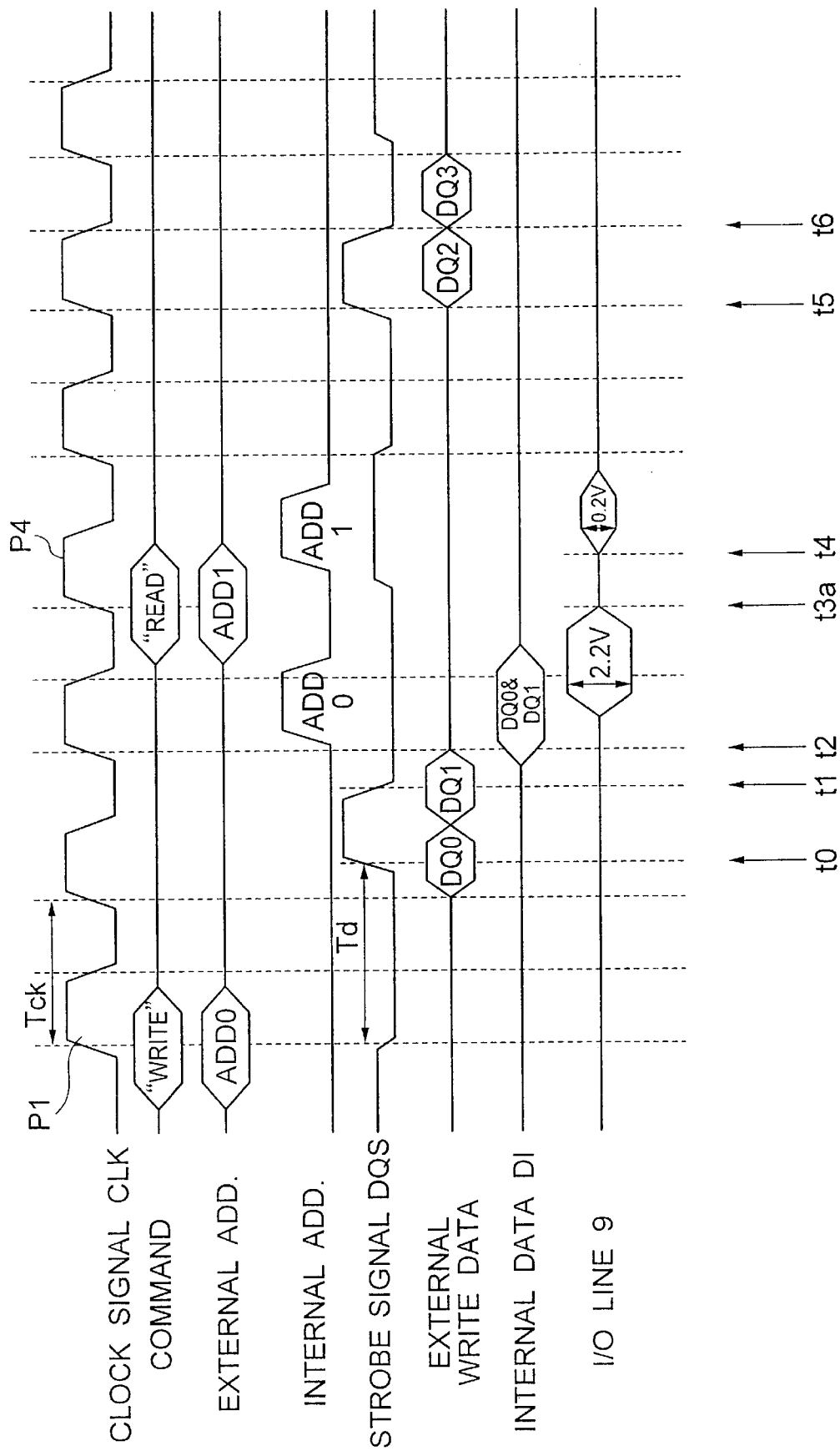
FIG. 4 is a timing chart of signals in the DDR-SDRM of FIG. 3.

Referring to FIG. 4, the DDR-SDRM of the present embodiment operates with a burst length of two, and starts for a write operation at a first clock pulse P1 of the system clock signal CLK. The write operation is performed for a pair of memory cells specified based on input address ADD0. The write data DQ0 and DQ1 are supplied from outside the DDR-SDRM. The data strobe signal DQS has a phase delay Td with respect to the system clock signal CLK, the phase delay being typically equal to the clock period Tck of the system clock signal CLK and residing between 75% and 125% of the clock period Tck based on the JEDEC standard.

The first external write data DQ0 is latched at the rising edge of the data strobe signal DQS at time t0 by the data latch 17, and the second external write data DQ1 is latched at the falling edge of the same data strobe signal DOS at time t1 by the data latch 17. The data latch 17 delivers both the first and second write data DQ0 and DQ1 as internal write data DI to the write buffer (write buffer section) 14 at time t1.

The write buffer 14 responds to the internal write data DI to deliver differential voltage signals through respective complementary I/O lines 19 to the memory cell plate 16. Thereafter, the I/O lines 19 are isolated from the bit line pairs at time t3a to end the write operation. It is to be noted that the write data DQ0 and DQ1 are transferred from the data latch 17 to the memory cells by responding to the data strobe signal DQS without using the system clock signal CLK.

A read operation is started at time t4 by responding to the rising edge of a fourth pulse P4 in the system clock signal CLK. The read data DQ2 and DQ3 and the data strobe signal DQS are generated in the DDR-SDRM. I/O lines 19 are coupled to the bit line pairs at time t4, followed by delivery of the differential voltage signal by the read amplifier 15. The first read data DQ2 is delivered at time t5 by responding to the rising edge of the data strobe signal DQS, and the second read data DQ3 is delivered at time t6 by responding to the falling edge of the data strobe signal.

Assuming that the clock period Tck, the time length necessary for coupling the complementary I/O liens 19 and the bit lines, and the phase delay Td of the data strobe signal DQS with respect to the system clock signal CLK are 6.5 ns, 4 ns and 8.125 ns (=Tck×1.25, i.e., maximum delay), respectively, the time t3a at which the write operation is finished occurs 1.625 ns earlier than the time t3b at which the write operation is finished in the conventional SDRAM. Thus, a corresponding time length can be used for the balancing time interval in addition to the time length obtained in the conventional device.

Figure 5:
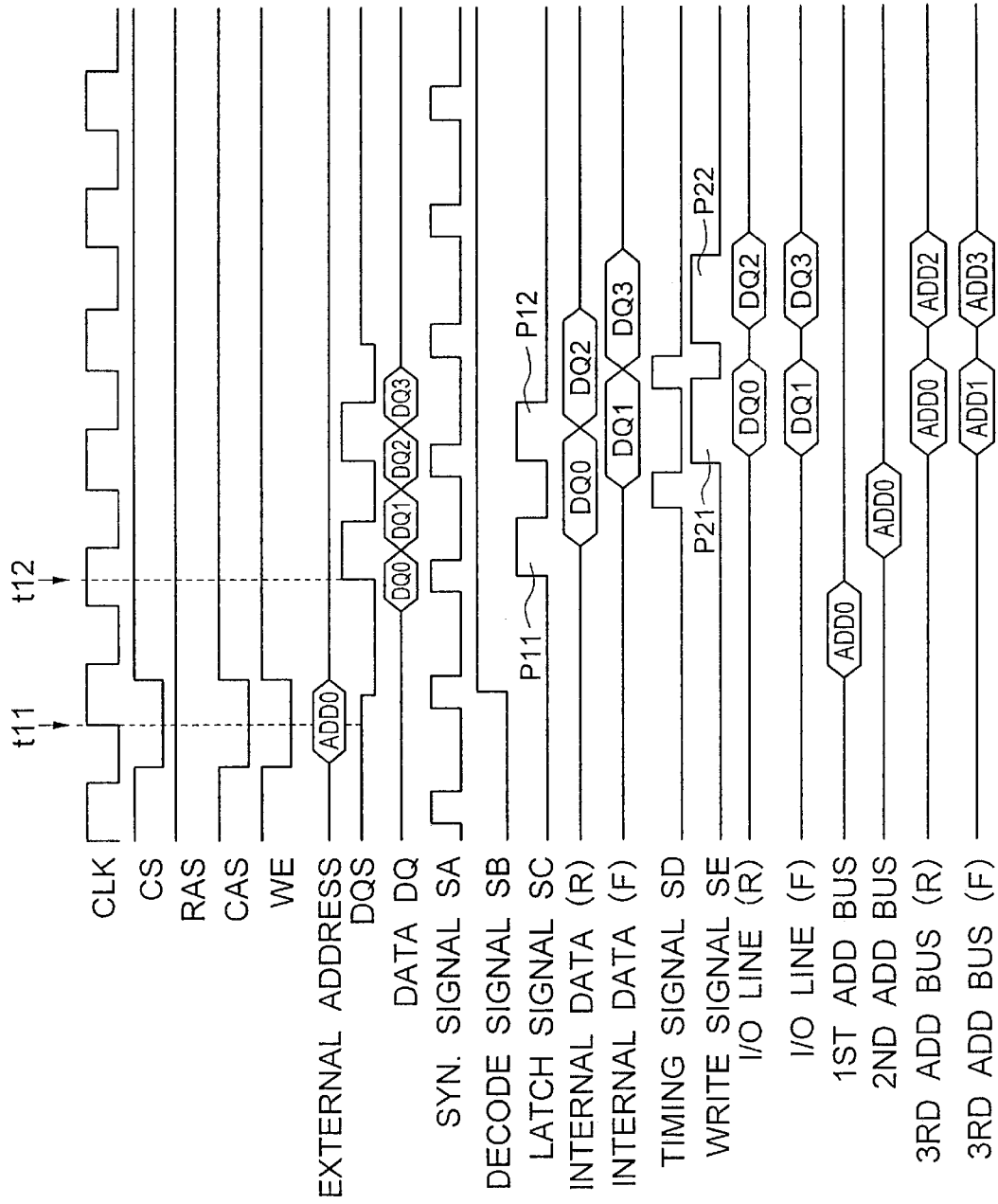
FIG. 5 is a detailed timing chart during a write operation of a modified first embodiment.

Referring to FIG. 5, there is shown a timing chart of a modification of the write operation shown in FIG. 4. In this modification, the burst length is four, wherein a write operation is performed to four memory cells in a single write cycle. Four data latches are provided in the data latch section 17, for latching four write data DQ0 to DQ3 in a single write cycle. The four write data are written into the memory cells specified by a single external address signal which indicates the first address ADD0 among the four addresses ADD0 to ADD3. Command signals and the external address signal are supplied from outside the memory device at time t11, whereby the write cycle for four memory cells is started.

The synchronizing signal SA is generated by responding to the rising edge of the system clock signal CLK, and supplied to the command decoder 12. The latch signals SC are generated at the rising edges and the falling edges of the data strobe signal DQS, and supplied to the data latch (latch section) 17 for latching. The timing signal SD is generated in synchrony with the falling edge of the system clock signal DQS, and supplied to the write timing generator 13.

The command decoder 12 responds to the synchronizing signal SA to decode the command signal, whereby the decoded signal indicating the write operation is supplied to the write timing generator 13. The data latch 17 latches the first data DQ0 at the rising edge of the first pulse P11 of the latch signal SC to hold the same as an internal data (R) for the I/O lines (R), latches the second data DQ1 at the falling edge of the first pulse P11 to hold the same as an internal data (F) for the I/O lines (F), latches the third data DQ2 at the rising edge of the second pulse P12 to hold the same as an internal data (R) for the I/O lines (R), and latches the fourth data DQ3 at the falling edge of the second pulse P12 to hold the same as an internal data (F) for the I/O lines (F). These latched data are delivered to the write buffer (write buffer section) 14 immediately after the latching. The write timing generator 13 supplies a write timing signal SE to the write buffer 14 in synchrony with the timing signal SD.

Referring to FIG. 7, the address processing section includes an address buffer 21 for receiving the external address signal, first and second latches 22 and 23 each for responding to the synchronizing signal SA to transfer the external address, an address latch section 24 for responding to the timing signal SD, a counter 26 and a column decoder 26.

The address latch section 24 latches the external first address ADD0 in synchrony with the system clock signal CLK through the internal address bus and the first and second latches 22 and 23, and delivers the first address ADD0 through a second internal address bus at the next clock cycle to the internal counter 25. The internal counter 25 generates second to fourth addresses ADD1 to ADD3 following the first address ADD0 and delivers first to fourth addresses ADD0 to ADD3 to the address latch section 24. The column decoder 26 then latches first and third addresses ADD0 and ADD2 through the internal address bus (R), and latches second and fourth addresses ADD1 and ADD3 through another internal address bus (F), by responding to the timing signal SD. The timing signal SD is generated at the falling edge of the data strobe signal DQS, and the write timing signal SF is generated based on the timing signal SD. More specifically, the write timing signal SE rises at the falling edge of the timing signal SD and falls at the rising edge of the timing signal SD a shown in FIG. 5.

The write buffer 14 delivers, at a first pulse P21 of the write timing signal SE, the first data DQ0 through I/O lines (R) to the memory cell of the first address ADD0, and the second a data DQ1 through I/O lines (F) to the memory cell of the second address ADD1. The write buffer 14 then delivers, at a second pulse P22 of the write timing signal SE, the third data DQ2 through I/O lines (R) to the memory cell of the third address ADD2, and the fourth data DQ3 through I/O lines (F) to the memory cell of the fourth address ADD3.

In the above embodiment, since the write buffer 14 operates for writing in synchrony with the signal generated based on the data strobe signal DQS, a longer time length can be secured for balancing the I/O lines 19 compared to the case wherein the write buffer 14 operates for writing in synchrony with the system clock signal CLK, as in the conventional DDR-SDRM. Thus, a read operation following the write operation does not cause an error due to the smaller balancing time interval.

Referring to Fig, 6, there is shown another timing chart of signals in a DDR-SDRM according to a second embodiment of the present invention. In the present embodiment, the input write data are supplied through two sets of input sections. The DDR-SDRM has two sets of write buffers 14, two sets of read amplifiers 15, and two sets of data latches for each of data (R) and (F) corresponding to the two sets of input sections for a single memory cell plate 16. Each set includes eight constituent elements, for example, for processing 64 write data during a single write cycle. These two sets of constituent elements are designated by U-side (upper side in the sequential order) and L-side (lower side in the sequential order) constituent elements in the drawing.

It is to be noted that the number of the input terminals for write data is sixteen, wherein the lower serial numbers (0 to 7) of the input terminals corresponds to L-side set and higher serial numbers (8 to 16) of the input terminals corresponds to U-side set. Thus, U-side input section receives 32 write data, designated by DQU0 to DQU3 in FIG. 6 each including eight data, in synchrony with pulses P31 and P32 in the data strobe signal UDQS, whereas L-side input section receives 32 write data, designated by DQL0 to DQL3 in FIG. 6 each including eight data, in synchrony with pulses P41 and P42 in the data strobe signal LDQS.

Figure 6:
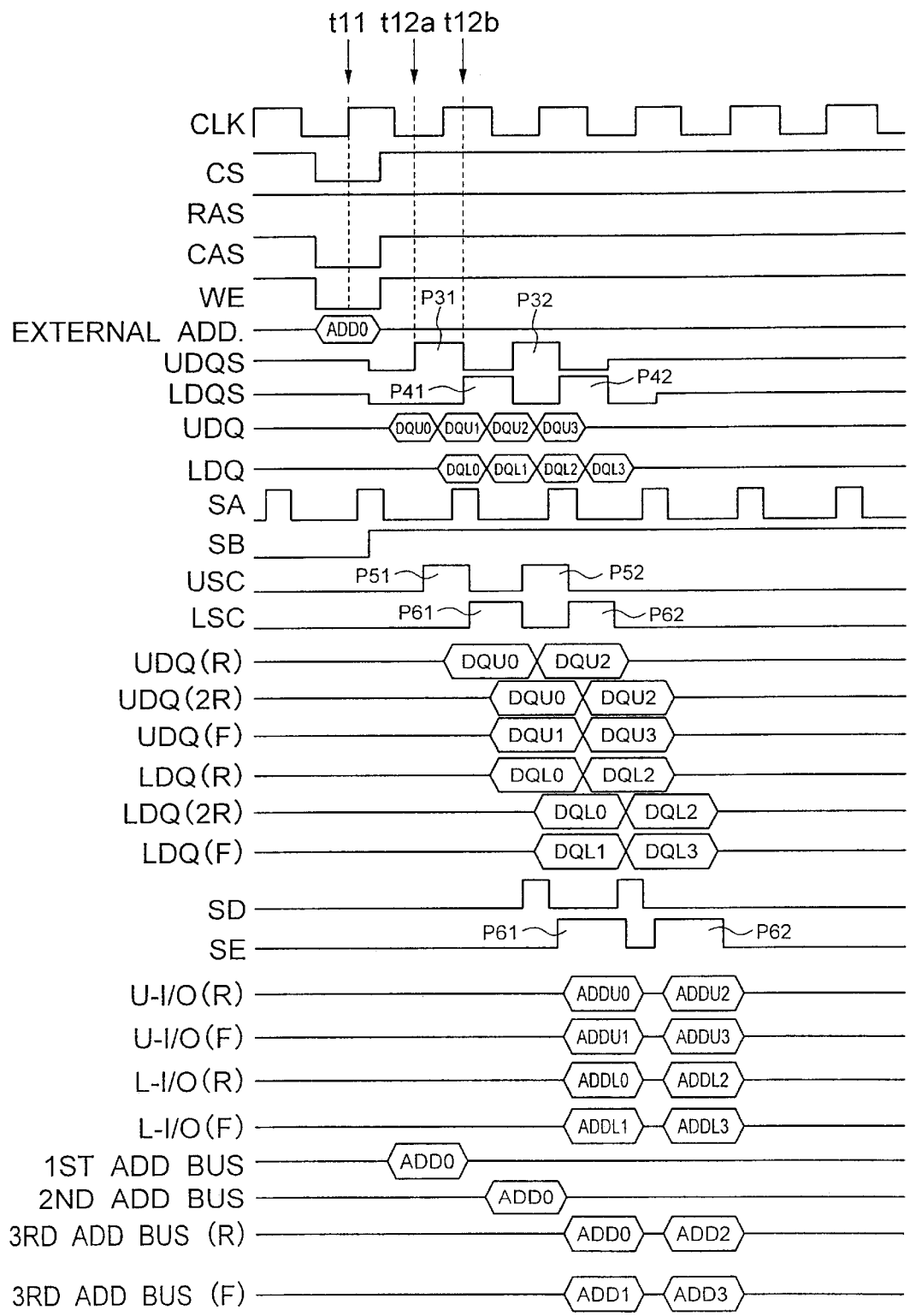
FIG. 6 is a timing chart of signals in a DDR-SDRM according to a second embodiment of the present invention.

In the example of FIG. 6, U-side data strobe signal UDQS leads with respect to L-side data strobe signal LDQS by half the clock period Tck of the system clock signal CLK. A write operation is started at time t11 for processing write data with a burst length of four by inputting an address signal ADD0. The first through fourth U-side write data DQU0 to DQU3 are supplied beginning at time t12a, with two successive pulses P31 and P32 of the U-side data strobe signal UDQS. In addition, the first through fourth L-side write data DQL0 to DQL3 are supplied beginning at time t13b with two successive pulses P41 and P42 of the L-side data strobe signal LDQS, having a delay of half the clock period Tck with respect to the U-side write data. The U-side and L-side data are separately processed by the two sets of processing sections.

Latch signals USC are supplied to the U-side data latches in synchrony with rising edges and falling edges of both the pulses P31 and P32 of the U-side data strobe signal UDQS. Similarly, latch signals LQS are supplied to the L-side data latches in synchrony with rising edges and falling edges of both the pulses P41 and P42 of the L-side data strobe signal LDQS.

A phase delay detection section detects both the phase delays of the U-side and L-side data strobe signals UDQS and LDQS with respect to the system clock signal CLK, and determines which delay of one of the data strobe signals UDQS and LDQS is longer with respect to the delay of the other of the data strobe signals UDQS and LDQS. The phase delay detection section selects the data strobe signal having a longer phase delay Td, and delivers a timing signal SD in synchrony with the falling edge of the selected data strobe signal to the write timing generator 13.

Each of the first U-side data latches 17 latches the first and third U-side data DQU0 and DQU2, while delaying the data latch by half the clock period Tck, as a set of internal data UDQ(2R). Each of the second U-side data latches 17 latches the second and fourth data DQU1 and DQU3 without a delay as a set of internal data UDQ(F). Thus, two sets of U-side data UDQ(2R) and UDQ(F) are delivered to the write buffer 14 at the same time.

On the other hand, each of the first L-side data latches 17 latches the first and third L-side data DQL0 and DQL2 while delaying the data latch by half the clock period Tck, as a set of internal data LDQ(2R). Each of the second U-side data latches 17 latches the second and fourth data DQL1 and DQL3 without a delay as a set of internal data LDQ(F). Thus, two sets of L-side data LDQ(2R) and LDQ(F) are delivered to the write buffer 14 at the same time, the L-side data LDQ(2R) and LDQ(F) being delayed by half the clock cycle Tck with respect to the U-side data UDQ(2R) and UDQ(F).

The write buffer 14 delivers data, at a first pulse P61 of the write timing signal SE, data DQU0 and DQL0 to the memory cells of the addresses ADDU0 and ADDL0, respectively, via U- and L-side I/O lines (R). The write buffer also delivers data, at the first pulse P61 of the write timing signal SE, data DQU1 and DQL1 to the memory cells of the addresses ADDU1 and ADDL1, respectively, via U-side and L-side I/O lines (F).

The write buffer 14 delivers data, at a second pulse P62 of the write timing signal SE, data DQU2 and DQL2 to the memory cells of the addresses ADDU2 and ADDL2, respectively, via U- and L-side I/O lines (R). The write buffer also delivers data, at the second pulse P62 of the write timing signal SE, data DQU3 and DQL3 to the memory cells of the addresses ADDU3 and ADDL3, respectively, via U-side and L-side I/O lines (F).

The internal addresses are generated by the internal address counter similarly to the first embodiment.

In the second embodiment, the write operation of the first through fourth data are started by responding to the data strobe signal LDQS which occurs among the data strobe signals UDQS and LDQS supplied to the DDR-SDRAM. This assures a safe writing operation, while assuring a sufficient time length for the balancing time interval of the I/O lines to prepare a next read operation.

In the second embodiment, if internal latches are provided in the data latch section 17 for latching all the data at a time, the write operation can be performed more safely.

In another alternative, if the input of the write data is conducted at a time for all the write data, the write operation can be performed further safely.

In the second embodiment, if a precharge command is generated in the write operation, the potentials of the word lines are lowered after a specified time interval since the generation of the command to store data in the memory cell. Then, bit lines are balanced or equalized for preparing the next write or read command In the second embodiment, since a sufficient balancing time interval is assured, the time interval between the precharge command and the command for the write or read command.

Since the above embodiments are described only for examples, the present invention is not limited to the above embodiments and various modifications or alterations can be easily made therefrom by those skilled in the art without departing from the scope of the present invention.

What is claimed is:

1. A double data rate synchronous DRAM (DDR-SDRM) comprising a memory cell array including a plurality of memory cells, an address signal processing section for receiving and processing an address signal for specifying an address of one of said memory cells, said address signal processing section operating in synchrony with a system clock signal, a data write section for receiving write data and writing the write data into said one of said memory cells in a write cycle, and a data read section for responding to said system clock signal to read data from said one of said memory cells in a read cycle to deliver read data, said data write section operating based on a data strobe signal transferred in synchrony with said write data to receive said write data from outside said DDR-SDRM and deliver said write data through I/O lines to said one of said memory cells.

2. The DDR-SDRM as defined in claim 1, wherein said data write section includes a data latch section for receiving said write data from outside said DDR-SDRM and a write buffer section for writing said write data to said one of said memory cells.

3. The DDR-SDRM as defined in claim 2, wherein said data latch section includes at least one first latch for responding to a rising edge of said data strobe signal and at least one second latch for responding to a falling edge of said data strobe signal to latch first write data and second write data, respectively, and said write buffer section writes said first write data and said second write data at a time based on said falling edge of said data strobe signal.

4. The DDR-SDRM as defined in claim 3, wherein either of said at least one first data latch and at least one second data latch includes a plurality of data latches, and said write buffer section includes write buffers in number corresponding to the number of data latches in each of said at least one first data latch and at least one second data latch.

5. The DDR-SDRM as defined in claim 3, wherein either of said at least one first data latch and at least one second data latches includes first latch block and second latch block each including a specified number of data latches.

6. The DDR-SDRM as defined in claim 5, wherein data latched by said at least one first data latch is delayed by half a clock period of said system clock signal in said latch section.

7. The DDR-SDRM as defined in claim 5, wherein said first and second latch blocks respond to said data strobe signal.

8. The DDR-SDRM as defined in claim 5, wherein said first latch block responds to said data strobe signal and said second latch block responds to another data strobe signal which has a phase delay equal to half a clock period of said system clock signal.

9. The DDR-SDRM as defined in claim 5, wherein said data strobe signal has a phase delay between 75% and 125% of a clock period of said system clock signal with respect to said system clock signal.

10. A double data rate synchronous DRAM (DDR-SDRM) comprising a memory cell array including a plurality of memory cells, an address signal processing section for receiving and processing an address signal for specifying an address if one of said memory cells, said address signal processing section operating in synchrony with a system clock signal, a data write section for receiving write data and writing the write data into said one of said memory cells in a write cycle, and a data section for responding to said system clock signal to read data from said one of said memory cells in a read cycle to deliver read data, wherein said data write section includes a data latch section for receiving said write data from outside said DDR-SDRM and a write buffer section for writing said write data to said one of said memory cells, and said data write section operating based on a data strobe signal transferred in synchrony with said write data to receive said write data from outside said DDR-SDRM and deliver said write data through I/O lines to said one of said memory cells.

11. The DDR-SDRM as defined in claim 10, wherein said data latch section includes at least one first latch for responding to a rising edge of said data strobe signal and at least one second latch for responding to a falling edge of said data strobe signal to latch first write data and second write data, respectively, and said writer buffer section writes said first write data and said second write data at a time based on said falling edges of said data strobe signal.

12. The DDR-SDRM as defined in claim 11, wherein either of said at last one first data latch and at least one second data latch includes a plurality of data latches, and said write buffer section includes write buffers in number corresponding to the number of data latches in each of the at least one first data latch and at least one second data latch.

13. The DDR-SDRM as defined in claim 11, wherein either of said at least one first data latch and at least one second data latches includes first latch block and second latch block each including a specified number of data latches.

14. The DDR-SDRM as defined in claim 13, wherein data latched by said at least one first data latch is delayed by half a clock period of said system clock signal in said latch section.

15. The DDR-SDRM as defined in claim 13, wherein said first and second latch blocks respond to said data strobe signal.

16. The DDR-SDRM as defined in claim 13, wherein said first latch block responds to said data strobe signal and said second latcjh block responds to another date stgrobe signal which has aphase delay euql to half a clock period of said system clock signal.

17. The DDR-SDRM as degined in claim 10, wherein said data strobe signal has a phase delay between 75% and 125% of a clock period of said system clock signal with respect to said system clock signal.

\* \* \* \* \*

UNITED STATES PATENT AND TRADEMARK OFFICE
CERTIFICATE OF CORRECTION

PATENT NO. : 6,445,642 B2
DATED : September 3, 2002
INVENTOR(S) : Murakami

It is certified that error appears in the above-identified patent and that said Letters Patent is hereby corrected as shown below:

<u>Column 8,</u>
Line 50, "if" should read -- of --.
Line 54, after "data" insert -- read --.

<u>Column 9,</u>
Line 3, "writer" should read -- write --.
Line 5, "edges" should read -- edge --.
Line 11, "the" should read -- said --.

<u>Column 10,</u>
Line 10, "latejh" should read -- latch --.
Line 10, "date" should read -- data --.
Line 10, "stgrobe" should read -- strobe --.
Line 11, "aphase" should read -- a phase --.
Line 11, "euql" should read -- equal --.
Line 13, "degined" should read -- defined --.

Signed and Sealed this

First Day of June, 2004

JON W. DUDAS
*Acting Director of the United States Patent and Trademark Office*